United States Patent
Ehmke

(10) Patent No.: US 9,796,585 B2
(45) Date of Patent: Oct. 24, 2017

(54) LEAK DETECTION USING CAVITY SURFACE QUALITY FACTOR

(71) Applicant: Texas Instruments Incorporated, Dallas, TX (US)

(72) Inventor: John Charles Ehmke, Garland, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/007,698

(22) Filed: Jan. 27, 2016

(65) Prior Publication Data
US 2017/0174511 A1    Jun. 22, 2017

Related U.S. Application Data

(60) Provisional application No. 62/268,631, filed on Dec. 17, 2015.

(51) Int. Cl.
*B81C 99/00* (2010.01)
*B81C 1/00* (2006.01)

(52) U.S. Cl.
CPC ........ *B81C 99/004* (2013.01); *B81C 1/00904* (2013.01)

(58) Field of Classification Search
None
See application file for complete search history.

(56) References Cited

U.S. PATENT DOCUMENTS

| | | | |
|---|---|---|---|
| 6,763,702 B2 | 7/2004 | Chien et al. | |
| 7,210,337 B1 | 5/2007 | Jarrett | |
| 7,739,900 B2* | 6/2010 | Reinert | G01M 3/186 73/40.7 |
| 8,256,298 B2 | 9/2012 | Suijlen et al. | |
| 8,579,502 B2* | 11/2013 | Abbink | B81C 3/008 374/45 |
| 8,701,459 B2* | 4/2014 | Geen | G01C 19/56 73/1.38 |
| 8,887,573 B2* | 11/2014 | Chen | H01L 27/0688 73/702 |
| 8,921,128 B2* | 12/2014 | Chen | B81C 99/0045 438/14 |

(Continued)

FOREIGN PATENT DOCUMENTS

EP    15245114 B1    10/2012

*Primary Examiner* — Abul Kalam
(74) *Attorney, Agent, or Firm* — Michael A. Davis, Jr.; Charles A. Brill; Frank D. Cimino

(57) ABSTRACT

A method of leak detection of hermetically sealed cavities semiconductor devices is provided. Scribe streets are formed with access from each packaged device on a first substrate to the edge of the first substrate. The first substrate is attached to a second substrate, forming gaps between the two substrates. A cavity is formed around a packaged device on the first substrate by attaching a bond ring to the first substrate and an optically transparent window above the bonding ring. The cavity is evacuated. A high powered laser beam strikes the top surface of the device on the first substrate within the cavity and creates a vertical surface displacement of the first substrate. The vertical surface displacement is monitored using a separate interrogation laser beam. Leakage of the cavity can be measured by characterizing the resonance decay rate, Q.

11 Claims, 5 Drawing Sheets

(56) References Cited

U.S. PATENT DOCUMENTS

2005/0081605 A1* 4/2005 Chin ................ H01L 21/67253
73/40.7
2005/0126295 A1* 6/2005 Correale ............... G01L 9/0016
73/702
2010/0158280 A1* 6/2010 Coronato .............. B81B 3/0072
381/174

* cited by examiner

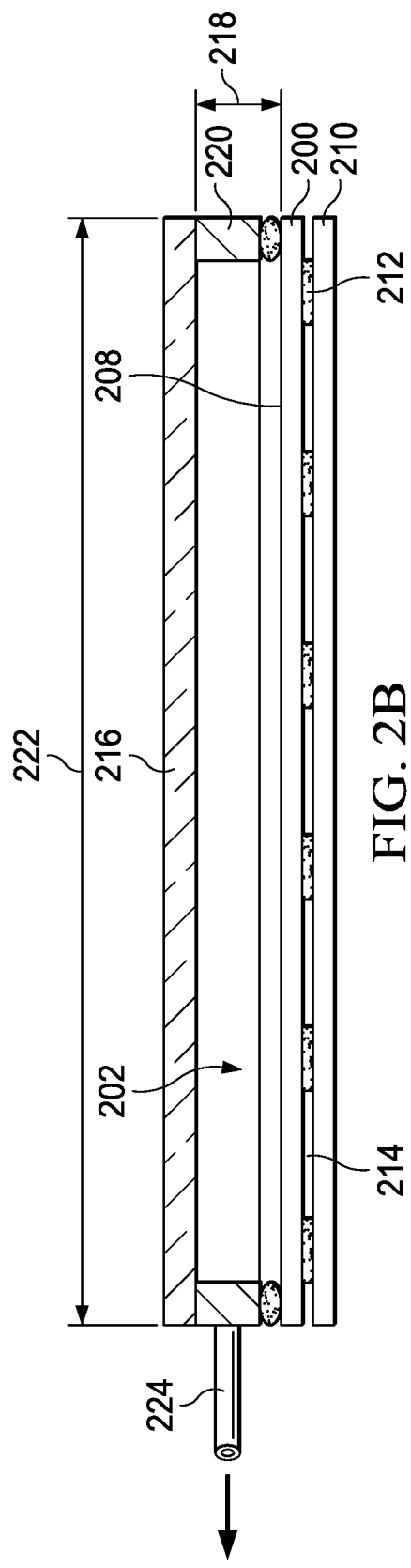
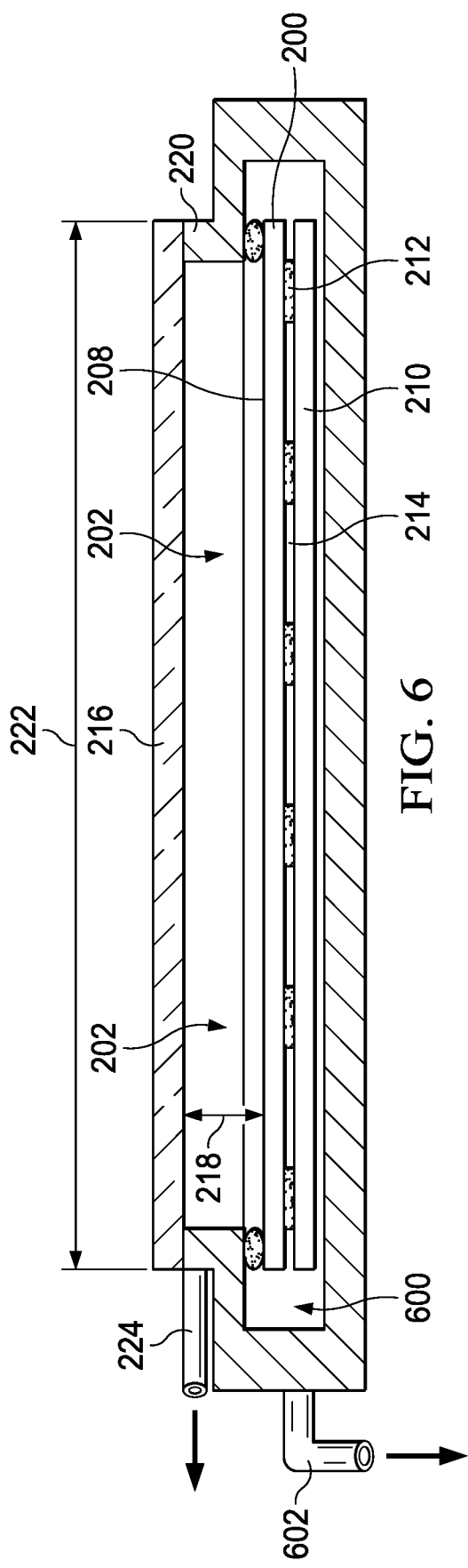

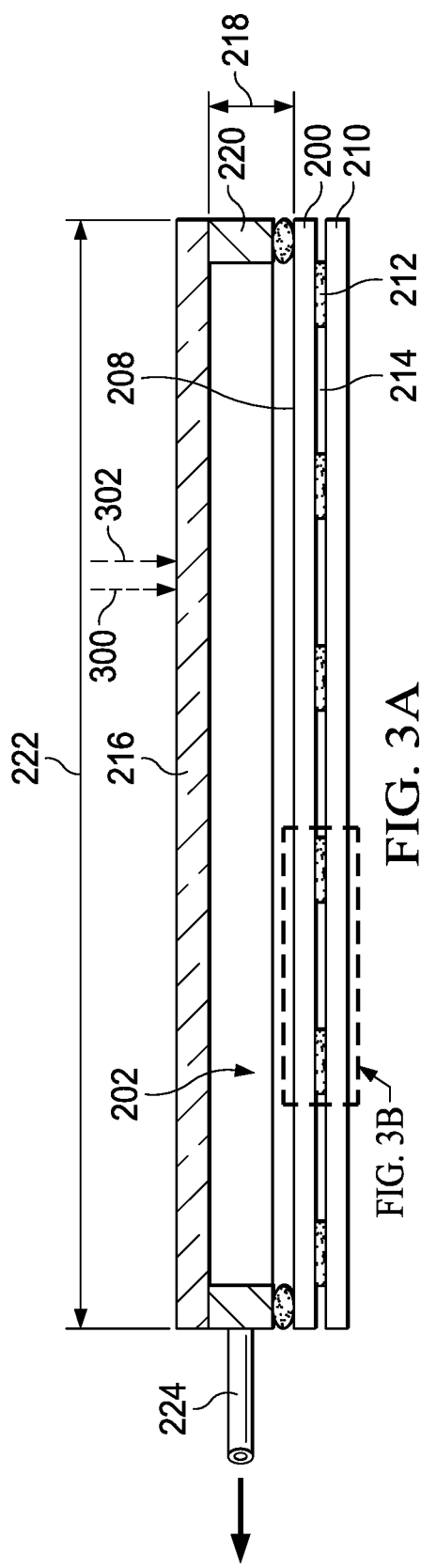
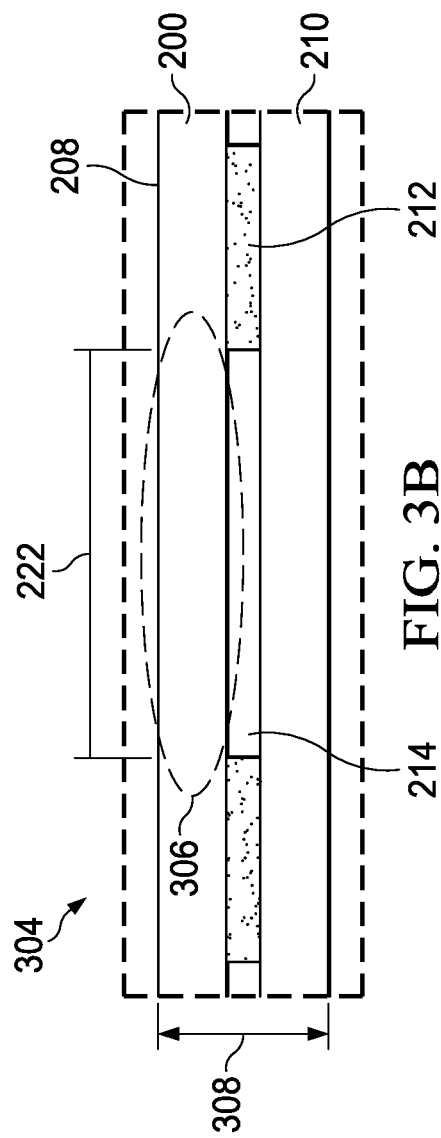
FIG. 3A
FIG. 3B

LEAK DETECTION USING CAVITY SURFACE QUALITY FACTOR

CROSS-REFERENCE TO RELATED APPLICATION

This application claims priority to U.S. Provisional Patent Application Ser. No. 62/268,631, filed Dec. 17, 2015, which is hereby fully incorporated herein by reference for all purposes.

FIELD OF THE INVENTION

This relates generally to microelectromechanical systems (MEMS), and more specifically, to MEMS devices with hermetically sealed cavities.

BACKGROUND

MEMS are devices which integrate small mechanical devices with semiconductors to form sensors (temperature, pressure, gas, moisture, and motion), accelerometers, valves, gears, actuators, and micromirrors. MEMS devices are often required to survive in hostile or toxic environments as medical, military, space, and other applications. They typically require hermetically sealed packages for proper operation. It may be difficult to establish whether a package is hermetically sealed. It is possible that a small leak may exist which is noticeable only after a long period of operation. A leaky cavity can render the device inoperable when the vacuum or operating environment no longer exists.

Particulate contamination within a cavity can reduce mechanical performance and moisture can cause changes in adhesion and cohesion. The effect of parameters such as temperature on moisture can vary from formation of ice at low temperatures to steam at high temperatures within a cavity.

Devices with cavities may require a vacuum or an atmosphere for operation. A leak detection test may be limited by its ability to function in only a vacuum or an atmosphere. It is also possible that a leak detection test may be limited by its ability to function only in singulated device form or only in wafer form.

Leak detection of cavities becomes more difficult as cavities become smaller. In MEMS devices using semiconductor substrates, leak detection errors may occur due to wafer bow and variation in substrate thickness. The need for special gases, liquids, or materials adds difficulty, complexity, and cost to the leak detection test.

A digital micromirror device (DMD), such as a Texas Instruments DLP® micromirror device, is typically placed in a hermetically sealed package prior to singulation. Micromirrors are sensitive to the environment. For example, if moisture is present within a micromirror cavity, then stiction or the ability of the mirror to tilt may deteriorate and the micromirror may require additional current or voltage to move between an "ON" state and an "OFF" state. It is also possible that the micromirror will be unable to move from a fixed position and form a defect in the micromirror array.

One method of detecting a leak in a device cavity involves flowing a reverse current through a PN junction diode. The test checks for the presence of moisture and humidity within the sealed cavity using changes in electrical parameters.

Another leak detection method involves introduction of a gas into a packaged device, evacuation of the cavity by vacuum suction, and a scan of the device for escaped gases using a spectrometer.

Yet another method of cavity leak detection comprises an oscillating structure where changes in a quality value are determined by applying pressure to the outside of a packaged sensor. Changes in oscillation are tied to changes in quality value.

Some methods for cavity leak detection may require special features such as optically clear windows, infra-red clear zones, or the use of radioactive gases. Methods requiring special internal structures or special gases or liquids for testing add cost and complexity to the test. For example, a method for leak testing using Krypton-85 radioisotope is sensitive and able to measure both gross and fine leak rates. It is a rapid technique but it has the disadvantage of requiring a radioactive gas, Krypton-85. The use of radioactive gases requires specific safety procedures which also increase cost and complexity.

FIG. 1A (Prior art) shows a wafer substrate 100 with devices 102 formed in a grid pattern. The grid is defined by scribe streets or scribe lines 104.

The substrate 100 is attached to a second substrate for support, using a bonding material. The two substrates are sawn prior to packaging the devices 102. The devices 102 are singulated into individual die by fracturing the substrates along sawn scribe lines.

FIG. 1B (Prior art) shows a cross-section of the wafer substrate 100 with devices attached to a support wafer 106. The substrate 100 is attached to the substrate 106 using a bonding adhesive 108. Devices 102 have been formed within the surface 110 of the top substrate 100. A gap is formed between substrate 100 and substrate 108 creating a small cavity 112 which is bounded by the bonding adhesive 108.

SUMMARY

This is for wafer level leak detection of a hermetically sealed cavity comprising MEMS devices using a quality surface factor.

Scribe streets are formed with access from each packaged device on a first substrate to the edge of the first substrate. The first substrate is attached to a second substrate, forming gaps between the two substrates. A cavity is formed around a packaged device on the first substrate by attaching a bond ring to the first substrate and an optically transparent window above the bonding ring. A method of evacuation is attached to the cavity. The cavity is evacuated.

A high powered laser beam strikes the top surface of the device on the first substrate within the cavity through the transparent window and creates a vertical surface displacement of the first substrate. The vertical surface displacement is monitored and characterized using a separate interrogation laser beam. Leakage of the cavity can be measured by characterizing the resonance decay rate, Q. The decay rate is representative of the internal pressure of the cavity and can be used to determine the internal gas pressure and leak rate.

The method of wafer level leak detection using cavity surface quality factors assumes that all sealed cavities have independent access to the edge of the wafer through scribe streets. This method is primarily targeted towards devices packaged under vacuum but may also be effective for gross leak detection for devices packaged under atmosphere.

BRIEF DESCRIPTION OF THE DRAWINGS

Example embodiments are described with reference to accompanying drawings, wherein:

FIGS. 2A-B show substrates with sealed device cavities.

FIGS. 3A-B illustrate a sealed cavity.

FIG. 6 illustrates a schematic of a sealed cavity for testing under atmosphere.

DETAILED DESCRIPTION OF EXAMPLE EMBODIMENTS

In an example embodiment, lasers are used to quantify relative vertical surface displacement of a substrate due to the environment within a sealed cavity.

Figure 1A:
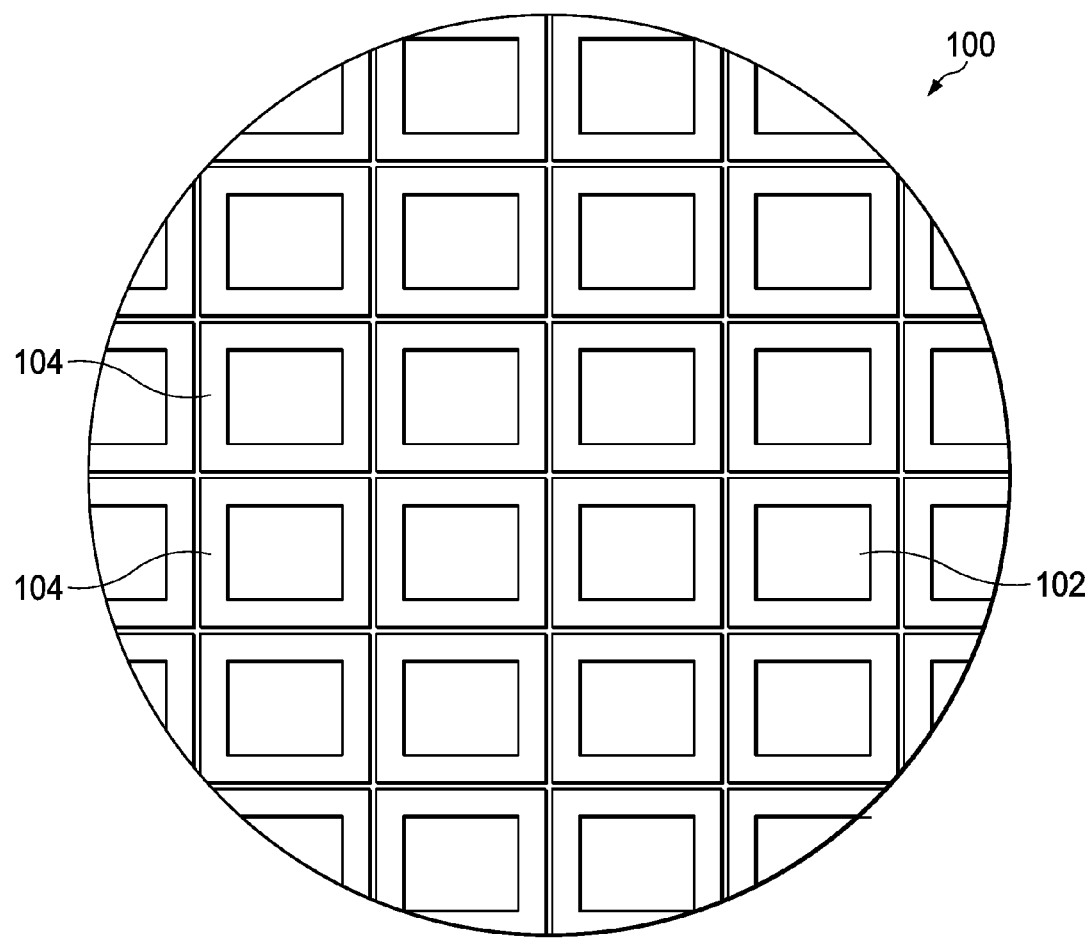
FIGS. 1A-1B (Prior Art) show a substrate wafer with devices attached to another substrate wafer.
Figure 1B:
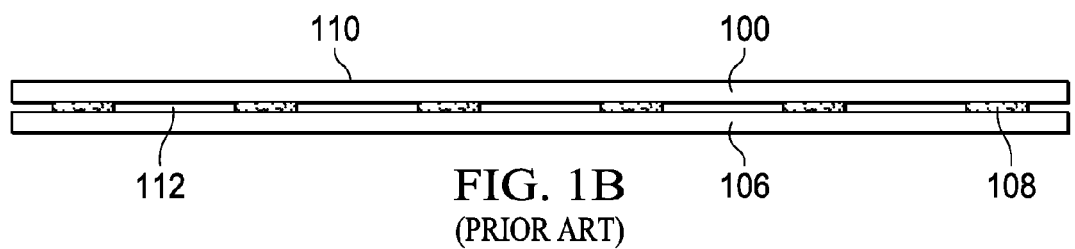
Figure 2A:
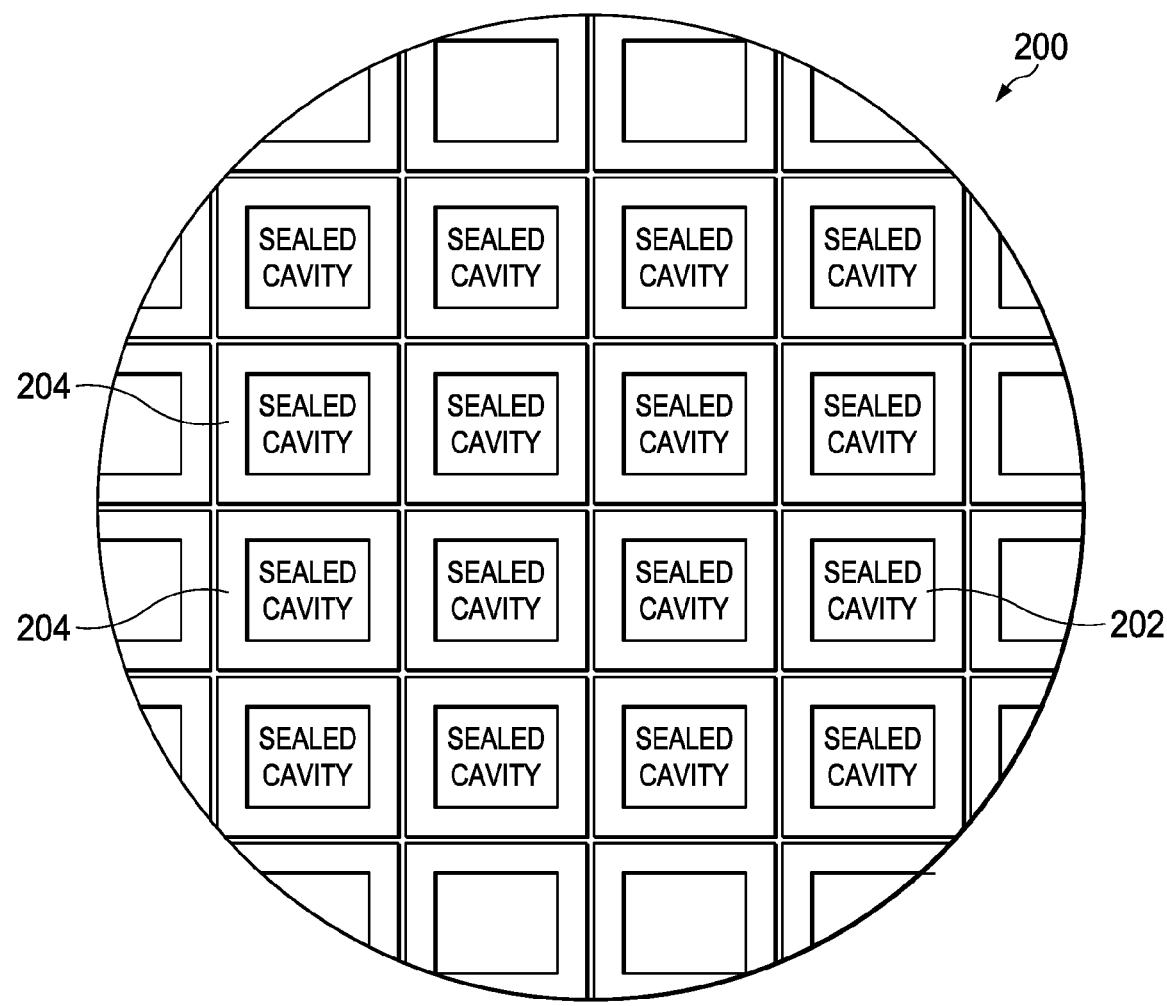

FIG. 2A shows a wafer substrate 200 with hermetically sealed cavities 202. Scribe streets or scribe lines 204 provide access to sealed devices. Each sealed cavity 202 has independent access to the edge of the wafer 200 through the scribe street 204. This arrangement can be effective for devices packaged under vacuum but may also be effective as gross leak detectors for devices packaged under atmosphere.

FIG. 2B shows a cross-section 206 of a sealed cavity 202.

Devices, such as MEMS devices, are formed within the top surface 208 of the substrate 200. Another substrate 210 is attached to the substrate 200 using bonding adhesive 212. The placement of adhesive 212 allows small gaps 214 to form between substrates 200 and 210. The substrate 210 provides mechanical support to the substrate 200. A plate 216 of glass or other optically transparent material is placed at a height 218 and supported by a bonding ring 220 above the substrate 210. Enclosing the device with the plate 216 and bonding ring 220 forms the cavity 202. The transparent plate 216 forms a window into the cavity 202. The cavity 202 has a length 222. An attachment 224 to one side of the cavity 202 allows the cavity 202 to be evacuated and a vacuum to be formed within.

FIG. 3A shows a method for testing of a sealed cavity 202 under vacuum using the cavity surface quality factor method.

The top surface 208 of the substrate 200 is struck or pinged with a beam 300 of a high power laser. The beam 300 creates an acoustic resonance within the surface 206. The acoustic resonance forms a vertical displacement 306 of the surface 208 during testing (FIG. 3B). A beam 302 from a separate interrogation Doppler laser continuously monitors the surface 208 through the window 216 for oscillation of the surface 208.

The bonding ring 220 is set at a distance 222 to allow an acoustic node to form and reflect the vibrational energy back into the substrate surface 208 under interrogation. The energy from the high powered laser beam 300 causes the vibrational displacement of substrate 200. The gap 214 between substrates 200 and substrate 208 allows space for vibrational displacement 306.

FIG. 3B is an expanded view of a portion 304 of the sealed cavity 300 and shows surface vibration or displacement 306 which forms due to the high power laser beam 300. A height 308 of the gap 214 allows the substrate 200 to vibrate.

Figure 4:
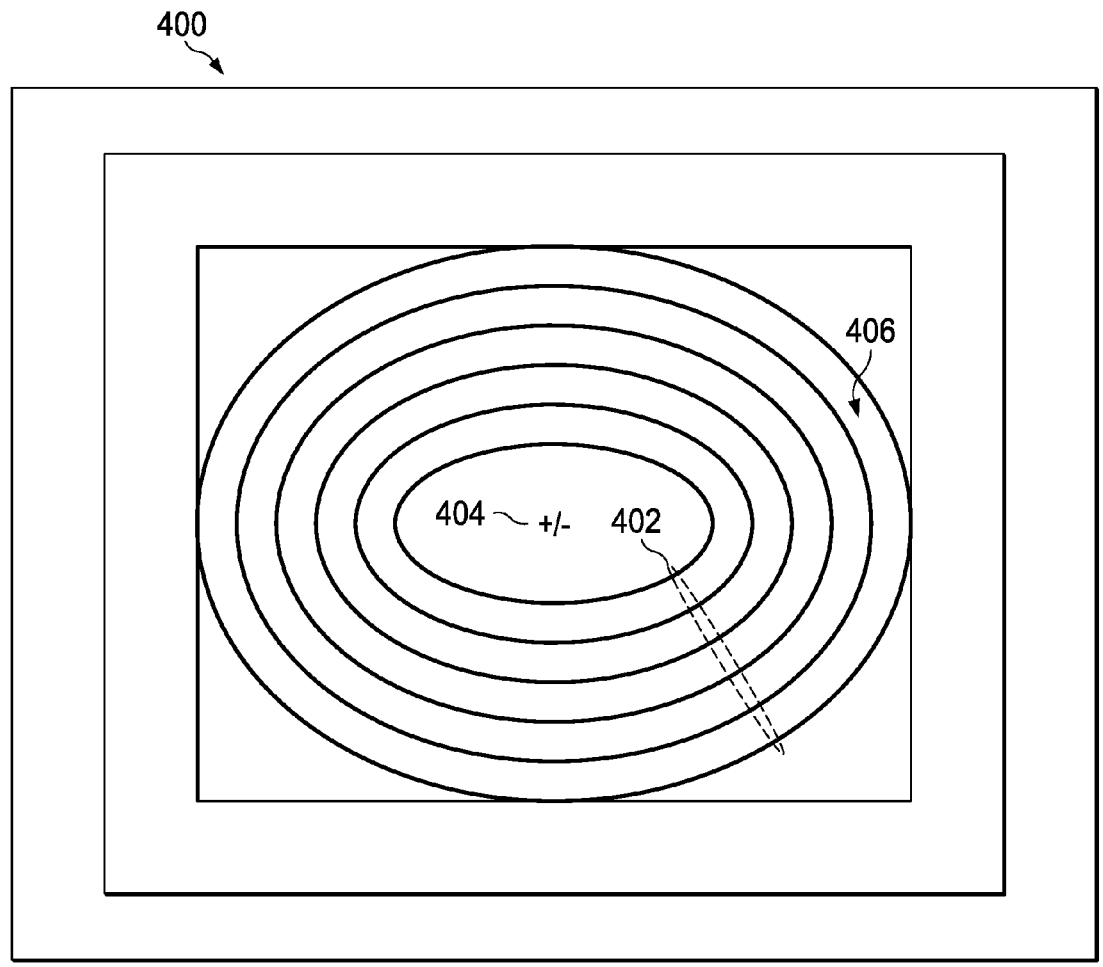
FIG. 4 is a vertical displacement contour graph.

FIG. 4 shows a contour graph 400 of the vertical displacement 306 of the substrate 200. As the high power laser beam 300 strikes the substrate 200, the substrate surface 208 vibrates and emits waves of displacement 306 in the form of oscillation rings 402. The interrogation laser beam 302 monitors the displacement waves.

The contour graph 400 is a top view of the oscillation rings 402 of the displacement waves. The center 404 of the contour graph 400 is the initial strike of the beam 300. The space 406 between the oscillation rings 402 represents the trough of the displacement waves. The oscillation rings 402 represents the peak of displacement waves.

Figure 5:
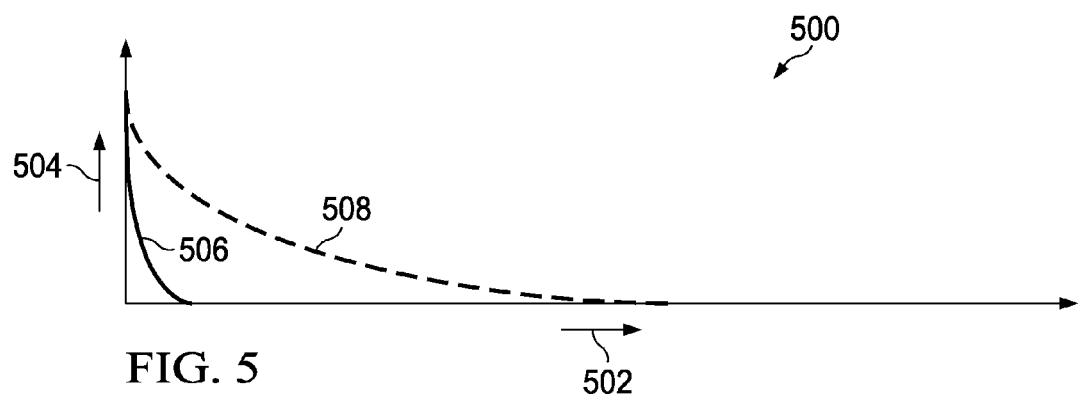
FIG. 5 is a graph of amplitude of decay rate Q versus time.

FIG. 5 shows a graph 500 of the decay of a displacement wave for a cavity 202 under vacuum. Time 502 is represented by the x-axis and resonance decay rate Q 504 is represented by the y-axis.

A resonance or displacement wave initiated by the high power laser beam 300 will dissipate more slowly inside a cavity 202 with a vacuum, for example, as shown in curve 508. A cavity 202 with a leak has larger losses and the displacement wave will decay more quickly, for example, as shown in curve 506. Within a leaky cavity 202, the internal atmosphere absorbs the acoustic energy. The bigger the leak, the more rapid the decay of the resonance wave as shown by the curve 506. The resonance decay rate, Q, is a measure of a leaky cavity in a hermetically sealed cavity 202. The slow resonance decay rate for curve 508 implies that the cavity 202 remains under seal. The faster decay rate for curve 506 shows the decay rate of a leaky cavity 202.

The primary energy losses are in the intrinsic substrate material, in this case silicon, and in the bonding material which is used to form the hermetic seal. These losses are small relative to losses from the presence of a gas or gases in the cavity 202.

FIG. 6 shows testing of the sealed cavity 202 under atmosphere. The cavity 202 is placed into a chamber 600. The chamber 600 is attached to the cavity 202 at the bonding ring 220 and sealed. The cavity 202 is surrounded by the chamber 600 on sides and along the bottom of the cavity 202. The window 216 remains transparent. The attachment 224 evacuates the chamber 202. Another attachment 602 connects the chamber 600 to a switchable vacuum. The chamber 600 may comprise either a vacuum or an atmosphere through the attachment 602.

The cavity 202 is evacuated and characterized with ping and interrogation laser beams 300 and 302. The cavity 202 is filled with one or more gases. A vacuum is applied to the chamber 600 and allowed to dwell for a fixed time. The cavity 202 is characterized again with the high power and interrogation laser beams 300 and 302. Differences between the decay rates Q for the cavity 202 before and after evacuation of chamber 600 show leakage of gases from chamber 202 to vacuum in chamber 600. The sensitivity of this method is limited by the time chamber 600 remains under vacuum.

The example embodiment allows wafer level leak detection of sealed cavities using cavity surface quality factors.

An advantage is that the method is an alternating current (AC) measurement which is immune to noise factors from direct current (DC) surface deflection characterization such as substrate thickness variation, wafer bow, etc.

Another advantage is that the method's sensitivity for vacuum bonded parts is limited by time and atmospheric pressure profile between bonding and testing. Vacuum bonded parts may be accelerated with a high pressure soak procedure before testing.

It is also an advantage that no special gases such as He or Kr are required for testing but low molecular weight gases can accelerate leaking with a high pressure soak step.

Yet another advantage is that very small cavities approximately equivalent to the thickness of the substrate can be leak tested by thinning the substrate to isolate acoustic characteristics between cavities.

Another advantage is that atmospheric access through scribe streets allows access to individual cavities. Sufficient pressure may remain within the scribe streets even after edge sealing to detect failure of leaky cavities.

Those skilled in the art to which the invention relates will appreciate that modifications may be made to the described example embodiments, and also that many other embodiments are possible, within the scope of the claimed invention.

What is claimed is:

1. A method of leak detection of a sealed cavity of a semiconductor device, the method comprising:
    forming scribe streets on a first wafer substrate with access from at least the semiconductor device on the first wafer substrate to an edge of the first wafer substrate;
    attaching the first wafer substrate to a second wafer substrate, such that gaps are formed between the first and second wafer substrates;
    forming the sealed cavity around the semiconductor device on the first wafer substrate by attaching a bonding ring to the first wafer substrate and an optically transparent window above the bonding ring;
    forming an attachment to the sealed cavity for evacuation of the sealed cavity;
    evacuating the sealed cavity;
    striking a top surface of the first wafer substrate within the sealed cavity with a high power laser beam to create a vertical surface displacement;
    monitoring the vertical surface displacement using a separate interrogation laser beam; and
    determining leakage of the sealed cavity, including by characterizing a resonance decay rate of the vertical surface displacement.

2. The method of claim 1, wherein the semiconductor device is a microelectromechanical system (MEMS) device.

3. The method of claim 2, wherein determining leakage of the sealed cavity comprises: establishing an excited acoustic mode in the semiconductor device; and measuring the excited acoustic mode for quality factor.

4. The method of claim 3, wherein measuring the excited acoustic mode comprises: measuring the excited acoustic mode to determine internal gas pressure and leak rate.

5. The method of claim 2, wherein determining leakage of the sealed cavity comprises: forming a chamber around the sealed cavity; and evacuating the chamber to measure leakage of the sealed cavity under atmosphere.

6. The method of claim 1, further comprising: singulating the semiconductor device.

7. A method of leak detection of a sealed MEMS cavity, the method comprising:
    forming scribe streets with access from a device on a first substrate to an edge of the first substrate;
    attaching the first substrate to a second substrate, and forming gaps between the first and second substrates;
    forming the sealed MEMS cavity surrounding the device on the first substrate by attaching a bonding ring to the first substrate and an optically transparent window above the bonding ring;
    forming an attachment to the sealed MEMS cavity for evacuation of the sealed MEMS cavity;
    evacuating the sealed MEMS cavity through the attachment;
    striking a top surface of the first substrate within the sealed MEMS cavity with a high power laser beam to create a vertical surface displacement;
    monitoring the vertical surface displacement using a separate interrogation laser beam; and
    measuring leakage of the sealed MEMS cavity, including by characterizing a resonance decay rate of the vertical surface displacement.

8. The method of claim 7, wherein measuring leakage of the sealed MEMS cavity comprises: establishing an excited acoustic mode in the device; and measuring the excited acoustic mode for quality factor.

9. The method of claim 8, wherein measuring the excited acoustic mode comprises: measuring the excited acoustic mode to determine internal gas pressure and leak rate.

10. The method of claim 7, wherein measuring leakage of the sealed MEMS cavity comprises: forming a chamber around the sealed MEMS cavity, and evacuating the chamber to measure leakage of the sealed MEMS cavity under atmosphere.

11. The method of claim 7, further comprising: singulating the device.

* * * * *